United States Patent [19]
Kaito

[11] Patent Number: 5,282,607
[45] Date of Patent: Feb. 1, 1994

[54] STRIPPING APPARATUS OF METAL FILM FROM METALLIZED PLASTIC FILM

[75] Inventor: Masao Kaito, Kyoto, Japan

[73] Assignee: Kaido Manufacturing Co., Ltd., Kyoto, Japan

[21] Appl. No.: 16,080

[22] Filed: Feb. 10, 1993

[30] Foreign Application Priority Data

Feb. 21, 1992 [JP] Japan .............................. 4-020229[U]
Mar. 6, 1992 [JP] Japan .............................. 4-024670[U]

[51] Int. Cl.⁵ .............................................. C22B 7/04
[52] U.S. Cl. ..................................... 266/205; 266/104
[58] Field of Search ......................... 266/103, 104, 205

[56] References Cited

U.S. PATENT DOCUMENTS

| | | | |
|---|---|---|---|
| 2,029,037 | 1/1936 | Scranton | 266/104 |
| 3,290,481 | 12/1966 | Hinkel | 266/104 |
| 3,469,829 | 9/1969 | Fujita et al. | 266/104 |

*Primary Examiner*—Scott Kastler
*Attorney, Agent, or Firm*—Oblon, Spivak, McClelland, Maier & Neustadt

[57] ABSTRACT

A stripping apparatus for stripping metal film from a metallized plastic film is provided. In accordance with one aspect of the invention, a rod is utilized for providing an anode or cathode charge, with the rod movable in a direction perpendicular to the direction of movement of the metallized plastic film. As a result, any remnants which may accumulate on the rod from a previous stripping operation do not adversely affect subsequent stripping operations. Further, a pressing roller is provided which is downstream of both of an anode/cathode roller and the cathode/anode rod. In another embodiment, a plurality of anode-cathode pairs are provided which are rotatably mounted. When one of the anode-cathode pairs is performing a stripping operation, another of the anode-cathode pairs can be cleaned by a brush or grinding device, such that a newly cleaned anode-cathode pair can be presented for each stripping operation.

6 Claims, 6 Drawing Sheets

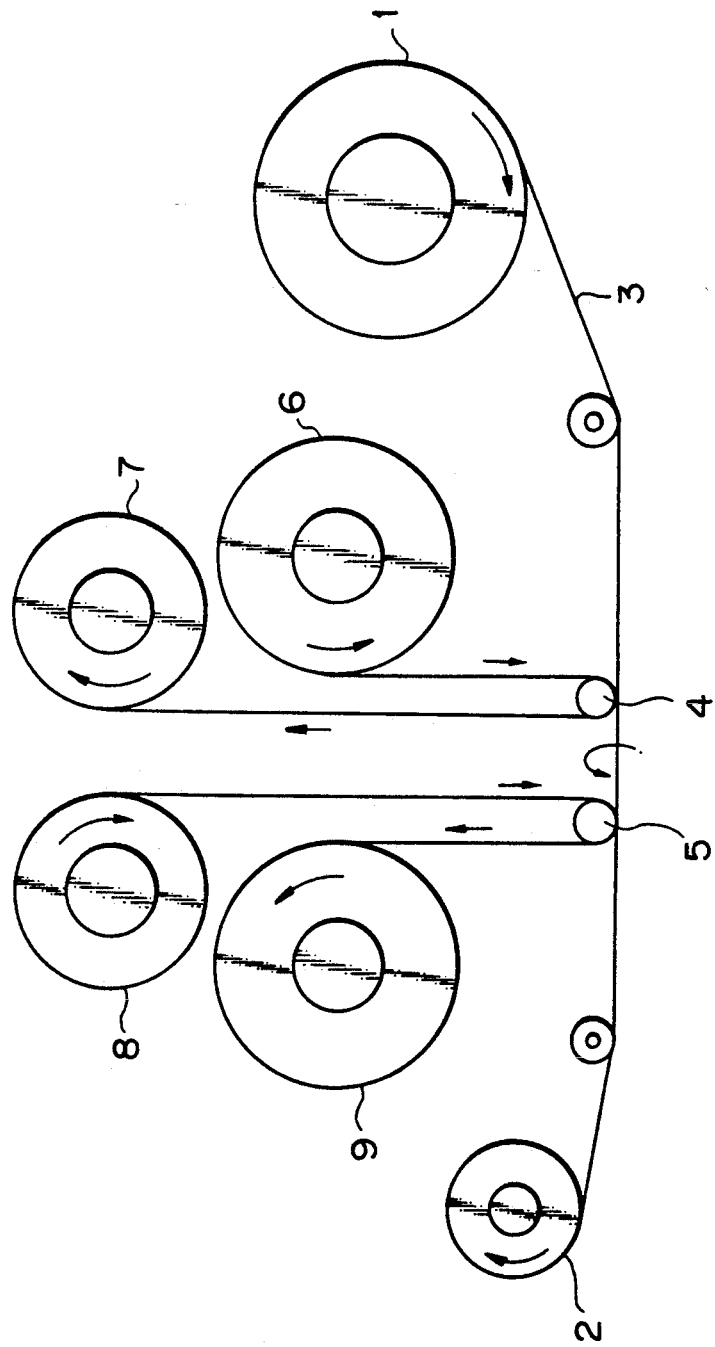

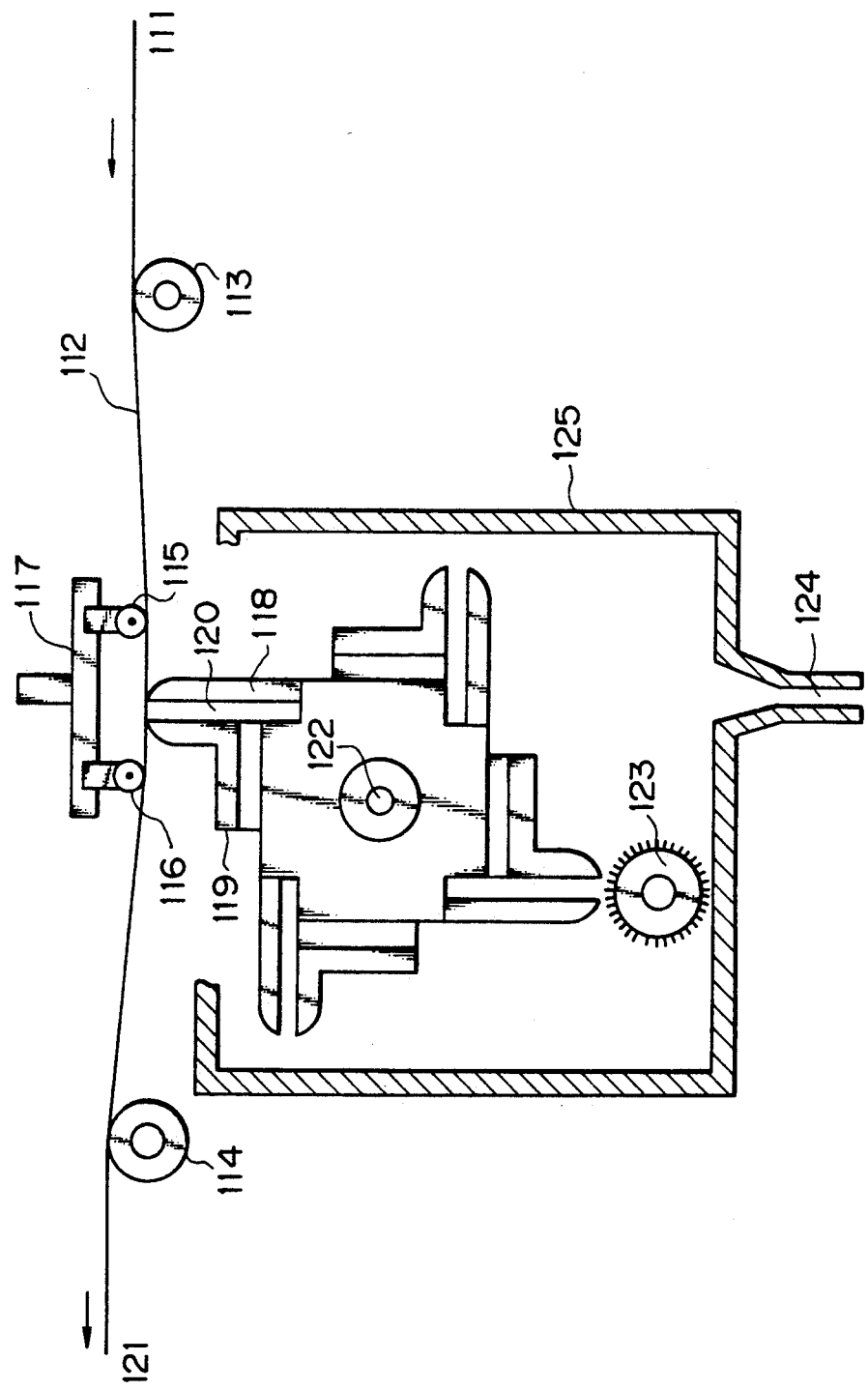

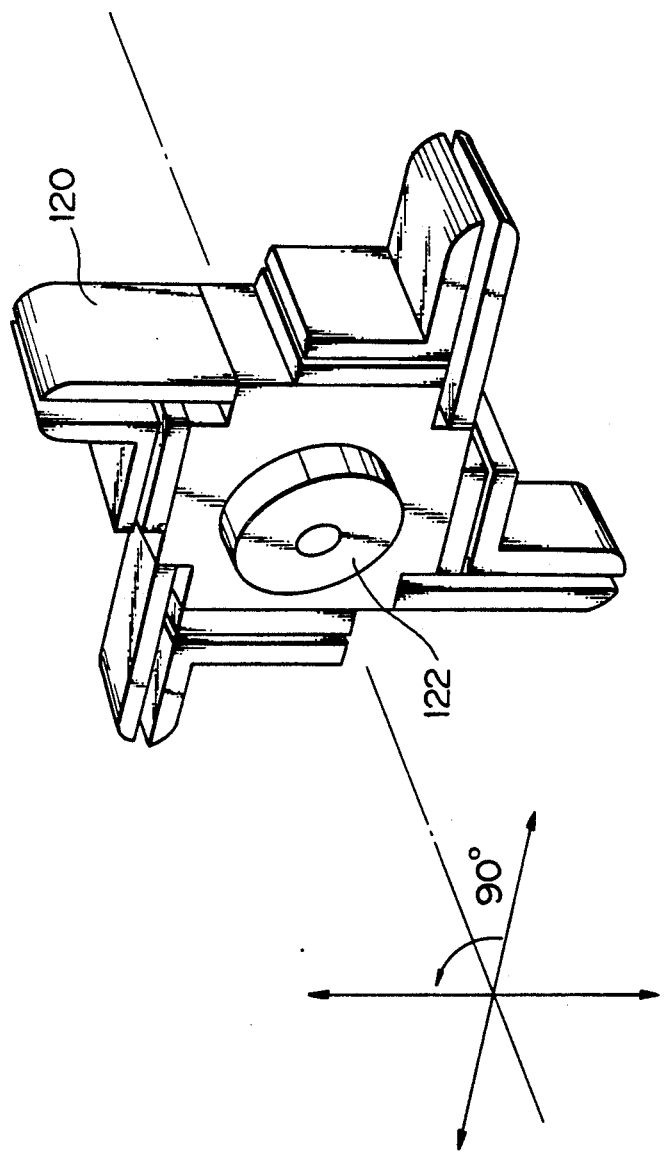

STRIPPING APPARATUS OF METAL FILM FROM METALLIZED PLASTIC FILM

BACKGROUND OF THE INVENTION

1. Technical Field

The present invention relates to a stripping apparatus for stripping a metal film from a metallized plastic film.

A metallized plastic film for a condensor is prepared by vacuum vapor deposition of a metal film, such as aluminum, onto one side of an extremely thin plastic film. In a condensor using such a metallized plastic film, when wound the cut ends of metal film wound one upon another often contact to cause a short-circuit. In order to prevent such a short-circuit it is necessary to partially strip the deposited metal film from the plastic film. In such a metallized plastic film, the beginning part of the winding is stripped and also, as shown in FIG. 1, a fixed length of metal film at regular intervals is stripped according to volume and pressure conditions (in the FIGURE, 01 is a metal film and 02 shows a stripped part).

2. DISCUSSION OF THE BACKGROUND

The prior stripping apparatus for stripping a metal film is, as shown in FIG. 2, constituted by providing electricity supplying rollers 4 and 5 between roll I and winding roll 2 on the metal film side of a metallized plastic film 3. Further, winding rolls 7 and 9 are provided for winding aluminum foil through the supplying rollers 4 and 5, respectively, with rolls 6 and 8 feeding aluminum foil and connecting supplying rollers 4 and 5 to a cathode (or anode) and an anode (or cathode), respectively.

When contacting supplying rollers 4 and 5 with the metallized plastic film 3 running from roll 1 to winding roll 2, and charging the cathode voltage (or anode voltage) and anode voltage (or cathode voltage) to the supplying rollers 4 and 5, respectively, only for a period of charging, the metal of the metal film is liquefied due to the current load. As a result, the vacuum vapor deposited face between the plastic film and the metal film is broken due to the elevated temperature, such that the metal film is stripped. The stripped metal film is transferred onto an aluminum foil on the supplying roller 5 to be wound upon winding roll 9.

The prior apparatus must be large in scale as a result of the equipment required for the stripping apparatus. In addition, the aluminum foils transferring the metal film thereon and wound upon the roll 9 and onto the roll 7 through the supplying roller 4 can only be scrapped and therefore are a large burden on the cost in the winding step. Further, there are many problems in that the remnants of stripped metal film accumulate at a point of contact of the supplying roller with the plastic film, as shown in FIG. 3.

SUMMARY OF THE INVENTION

An object of the present invention is therefore to solve the above problems by providing a stripping apparatus for stripping a metal film from a metallized plastic film, in which the apparatus is compact and, in which the remnants of metal film stripped are prevented from diffusing or dispersing.

BRIEF DESCRIPTION OF THE DRAWINGS

FIG. 2 illustrates a prior stripping apparatus for stripping metal film from a metallized plastic film;

FIG. 6 illustrates another embodiment of the stripping apparatus of the present invention; and FIG. 7 is a perspective view of stripping means in accordance with an embodiment of the present stripping apparatus.

DESCRIPTION OF THE PREFERRED EMBODIMENTS

Figure 1:
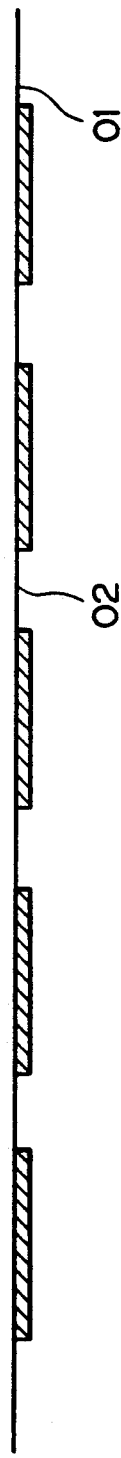
FIG. 1 illustrates a metal film stripped from a metallized plastic film.
Figure 3:
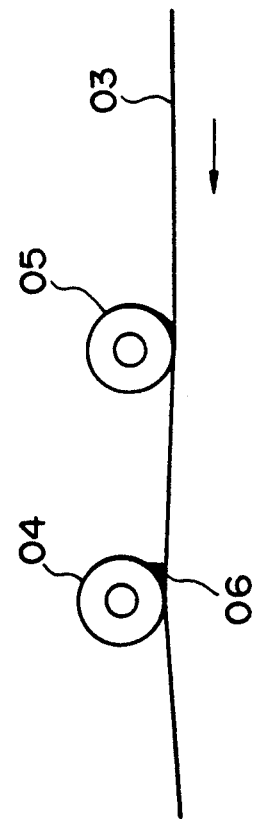
FIG. 3 shows remnants of a stripped metal film accumulated at a point of contact of supplying rollers with the plastic film in the prior apparatus.

As a result of applying himself to research, the present inventor has recognized an arrangement for stripping a metal film utilizing an electrode roller which contacts the metal film of a metallized plastic film running by a winding arrangement to supply an anode voltage or a cathode voltage thereto, and with an electrode rod for supplying a cathode voltage or an anode voltage. The electrode roller and electrode rod extend across the running direction of the metallized plastic film in contact with the metal film. In accordance with another aspect of the invention, stripping of a metal film is accomplished by a pair of taper type electrodes contacting the metal film of a metallized plastic film running by a winding arrangement to supply an anode voltage or a cathode voltage thereto, with an arrangement provided for grinding the remnants of the metal film stripped and sticked to the electrode, and removal of the dust of stripped metal film by absorption or exhaust.

The present stripping apparatus for stripping metal film from a metallized plastic film comprises providing, between a roll 11 of the metallized plastic film 13 and a winding roll 12, a cathode voltage (or anode voltage) supplying roller 14 and an anode voltage (or cathode voltage) charging electrode rod extending at right angles with respect to the running direction of the plastic film at fixed intervals on the metal film side of the metallized plastic film. A pressing roller 17 is provided parallel to and below the electrode rod, with the rod being movable at right angles with respect to the running direction of the plastic film. An arrangement is also provided for cleaning the remnants of the stripped metal film.

Figure 4:
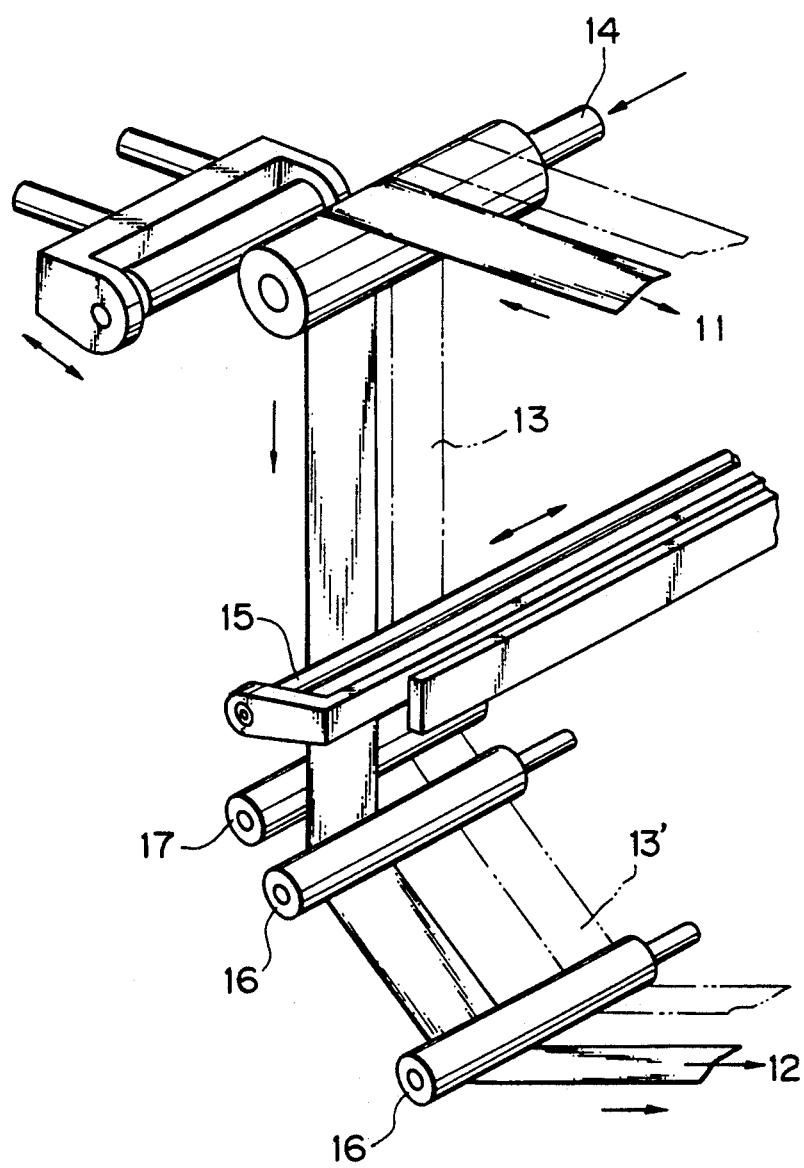
FIG. 4 is a perspective view of an embodiment of the stripping apparatus of the present invention.

The stripping apparatus of the present invention will be now explained in detail with reference to FIG. 4.

A metallized plastic film 13 fed from roll 11 (not show in the FIGURE but schematically represented in the direction of the arrow) contacts with supplying roller 14 to be charged with a cathode voltage (or anode voltage). The film 13 then passes an electrode rod 15 for charging an anode voltage (or cathode voltage) at a fixed interval, and is then wound onto winding axis 12 (not shown in the FIGURE but schematically represented in the direction of the arrow) through guiding roller 16.

Figure 5A:
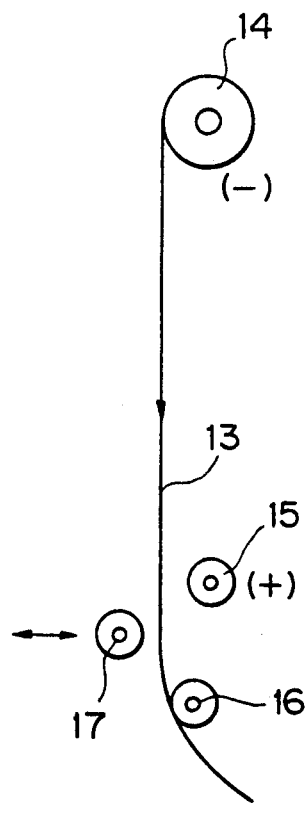
FIG. 5 illustrates the action of a pressing roller in the stripping apparatus of the present invention.
Figure 5B:
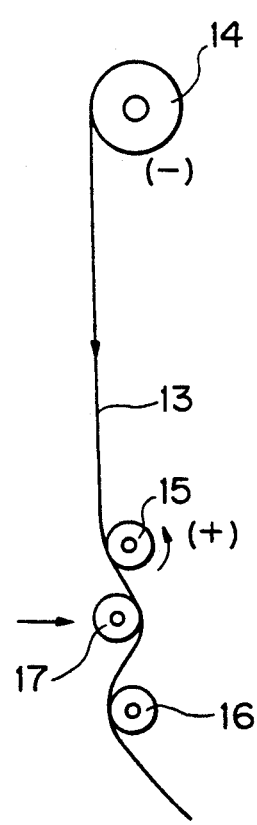

Below the electrode rod 15 providing a charge voltage, a pressing roller 17 is provided parallel thereto and, during stripping, as shown in FIG. 5 (5A shows the arrangement when not stripping and 5B shows the arrangement during stripping), the roller 17 presses the running metallized plastic film 13 into contact with the electrode rod 15, thereby providing an anode voltage charge (or cathode voltage) to the plastic film. As a result, a metal of the metal film deposited on the metallized plastic film between the supplying roller 14 and electrode rod 15 is liquefied, due to the current load and the vacuum vapor deposited face between plastic film and metal film is broken due to the elevated temperature such that the metal film is stripped.

Since the remnants of the stripped metal film are accumulated onto the face of the electrode rod 15, the electrode rod 15 is moved in the direction perpendicular (indicated by the double arrow of FIG. 4) to the running direction of film, or in other words, the rod is moved axialy, in order to resume the next stripping action with the new face. The electrode is brushed to remove the remnants of stripped metal film accumulated thereon thereby providing a new face or cleaned face.

Further, in accordance with the present stripping apparatus for stripping of a metal film from a metallized plastic film an arrangement is provided which includes $360/\alpha$ of stripping means, each of which includes a taper type anode and an opposing taper type cathode with a narrow space therebetween (a few millimeters). The stripping arrangements are provided at a space of $\alpha°$ around a central axis and rotate $\alpha°$ every stage (herein $\alpha°$ is 10, 20, 30, 40, 60, 90 or 180), with a pressing roller provided for pushing down the metallized plastic film held between the two holding rollers to press the film into contact with the anode and cathode. The pressing roller is movable upward and downward, and a grinding arrangement is provided for removing the remnants of stripped metal film stuck on said taper type anode and cathode. A housing contains the striping and grinding arrangements with the housing provided with an opening in the upper part so that the anode and cathode are able to contact the metallized plastic film by pushing down the pressing arrangement, with a dust absorbing mouth in the lower part.

The above embodiment of the stripping apparatus of the present invention will be explained in further detail with reference to FIG. 6.

Between holding rollers 113 and 114 a metallized plastic film 112 is fed from the roll (not shown in the FIGURE) and is pressed down by a pressing arrangement 117 composed of pressing rollers 115 and 116, to contact the stripping arrangements or stripping pairs 120 composed of a taper type anode (or cathode) 118 and a taper type cathode (or anode) 119 which are charged with a voltage such that the metal film is stripped and the film is wound upon a winding roll 121 (not shown in the FIGURE). As shown in FIG. 7, four of the stripping arrangements or stripping pairs 120 are provided at intervals of 90 degrees around the central axis 122, with a 90 degree rotation provided after each stripping step. In the position of rotation of 180 degrees from the stripping location, the remnants of stripped metal film are removed by a rotating grinding brush 123.

Thus, the metal film contacts a newly ground taper type anode (or cathode) 118 and taper type cathode (or anode) 119 for each stripping operation. The four stripping arrangements 120 provided around the central axis 122 and rotating the grinding brush 123 are provided within a housing 125 which is opened its upper part such that taper type electrodes 118 and 119 are able to contact the metallized plastic film 112 by a pressing weight 117. The housing is also provided with a dust absorbing mouth 124 in the lower part. Thus, the dust remnants of stripped metal film are exhausted by absorption from the housing and are prevented from diffusing to the outside.

In the prior art apparatus, the width of the film to be stripped is limited to the diameter of the supplying roller used. In contrast, with the stripping apparatus of the present invention, the width of film to be stripped can be sufficiently decreased since the taper type electrode is used, and the remnants of the stripped metal film are not accumulated at the contact point of the roller and plastic film (as in the case of using the supplying roller), but drop through the gap between the electrodes to be exhausted from the dust absorbing mouth in the lower part.

Further, the stripping apparatus of the present invention is simple and compact, in comparison with the prior apparatus, in which aluminum foil is not wastefully used thereby resulting in remarkable cost savings.

What is claimed is:

1. An apparatus for stripping a metal film from a metallized plastic film comprising:
    a voltage supplying roller for supplying one of a cathode voltage and an anode voltage;
    a voltage supplying rod for supplying the other of an anode voltage and a cathode voltage, said voltage supplying rod spaced from said voltage supplying roller in a direction of movement of said metallized plastic film;
    a pressing roller for urging said metallized plastic film into contact with at least one of said voltage supplying roller and said voltage supplying rod; and
    means for moving said voltage supplying rod in an axial direction of said voltage supplying rod such that a clean surface of said rod can be presented and adverse effects resulting from accumulation of remnants upon said voltage supplying rod are avoided.

2. The apparatus of claim 1, wherein said pressing roller is disposed downstream of both of said voltage supplying roller and said voltage supplying rod.

3. An apparatus for stripping a metal film from a metallized plastic film comprising:
    means for moving a metallized plastic film along a transport path;
    a plurality of stripping pairs, each stripping pair including a taper type anode and a taper type cathode spaced from one another;
    means for rotatably mounting said plurality of stripping pairs such that one pair at a time is disposed adjacent said transport path of said metallized plastic film;
    pressing means for pressing the metallized plastic film against one of said stripping pairs disposed adjacent said transport path; and
    cleaning means disposed at a location remote from said transport path of said metallized plastic film for cleaning one of said stripping pairs which is not adjacent said transport path and not being utilized for performing a stripping operation, whereby one stripping pair at a time can be utilized for performing a stripping operation, while a pair which is not being utilized for a stripping operation can be cleaned by said cleaning means such that a cleaned stripping pair can be presented for each stripping operation.

4. The apparatus of claim 3, further including a housing for containing said grinding means, said plurality of stripping pairs and said means for rotatably mounting said plurality of stripping pairs, said housing including an opening at which one of said stripping pairs is disposed adjacent said transport path by said means for rotably mounting said plurality of stripping pairs for performing a stripping operation, said housing also including an exhaust outlet for removing dust and debris from said housing.

5. The apparatus of claim 4, wherein said opening is disposed at a first side of said housing, and a mouth of said exhaust outlet is disposed along a wall of said housing on a side of said housing opposite said opening, and wherein said cleaning means is disposed adjacent said wall having said mouth of said exhaust outlet disposed therealong.

6. The apparatus of claim 3, wherein said cleaning means including a grinding brush.

* * * * *